United States Patent
Basker et al.

(10) Patent No.: US 9,412,643 B2
(45) Date of Patent: Aug. 9, 2016

(54) SHALLOW TRENCH ISOLATION FOR END FIN VARIATION CONTROL

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-Chen Yeh, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/732,881

(22) Filed: Jun. 8, 2015

(65) Prior Publication Data

US 2015/0270264 A1   Sep. 24, 2015

Related U.S. Application Data (62) Division of application No. 14/223,106, filed on Mar. 24, 2014.

(51) Int. Cl.
| | |
|---|---|
| H01L 27/088 | (2006.01) |
| H01L 29/06 | (2006.01) |
| H01L 29/49 | (2006.01) |
| H01L 21/762 | (2006.01) |
| H01L 29/66 | (2006.01) |
| H01L 29/78 | (2006.01) |

(52) U.S. Cl.
CPC ...... *H01L 21/76224* (2013.01); *H01L 27/0886* (2013.01); *H01L 29/0649* (2013.01); *H01L 29/4916* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 8,003,466 B2 | 8/2011 | Shi et al. | |
| 8,492,235 B2 | 7/2013 | Toh et al. | |
| 2002/0197822 A1 | 12/2002 | Liu et al. | |
| 2010/0267238 A1* | 10/2010 | Johnson | H01L 29/66795 438/692 |
| 2011/0084340 A1* | 4/2011 | Yuan | H01L 21/76224 257/368 |
| 2011/0147839 A1 | 6/2011 | Yagishita et al. | |
| 2011/0298058 A1 | 12/2011 | Kawasaki et al. | |
| 2012/0074386 A1 | 3/2012 | Rachmady et al. | |
| 2012/0126329 A1 | 5/2012 | Lee | |
| 2012/0273895 A1 | 11/2012 | Anderson et al. | |
| 2013/0093040 A1 | 4/2013 | Kim et al. | |
| 2013/0161762 A1 | 6/2013 | Kelly et al. | |
| 2014/0203376 A1* | 7/2014 | Xie | H01L 21/76224 257/401 |
| 2014/0227857 A1* | 8/2014 | Youn | H01L 21/76229 438/427 |
| 2014/0231919 A1* | 8/2014 | Peng | H01L 21/76224 257/368 |

* cited by examiner

*Primary Examiner* — Khaja Ahmad
(74) *Attorney, Agent, or Firm* — Cantor Colburn LLP; Vazken Alexanian (57) ABSTRACT

A method of fabricating a fin field effect transistor (FinFET) device and the device are described. The method includes forming a deep STI region adjacent to a first side of an end fin among a plurality of fins and lining the deep STI region, including the first side of the end fin, with a passivation layer. The method also includes depositing an STI oxide into the deep STI region, the passivation layer separating the STI oxide and the first side of the end fin, etching back the passivation layer separating the STI oxide and the first side of the end fin to a specified depth to create a gap, and depositing gate material, the gate material covering the gap.

10 Claims, 16 Drawing Sheets

SHALLOW TRENCH ISOLATION FOR END FIN VARIATION CONTROL

DOMESTIC BENEFIT/NATIONAL STAGE INFORMATION

This application is a divisional of U.S. application Ser. No. 14/223,106 filed Mar. 24, 2014, the disclosure of which is incorporated by reference herein in its entirety.

BACKGROUND

The present invention relates to a multi-gate, fin-based field effect transistor (FinFET), and more specifically, to hybrid shallow trench isolation (STI) with both shallow and deep STI.

Multi-gate FinFETs require both shallow and deep STIs to prevent leakage current between adjacent devices. Typically, FinFET devices are fabricated by shallow STI formation followed by an active silicon cut process to etch out the active silicon region and form deep STI. Overlay misalignment during this process may cause the end fins to not be completely covered by the polysilicon conductor. As a result, the end fins submerged in the STI without polysilicon deposition may lead to poor short channel control and may potentially lead to leaks.

SUMMARY

According to one embodiment of the present invention, a method of fabricating a fin field effect transistor (FinFET) device including both shallow and deep shallow trench isolation (STI) regions includes forming a deep STI region adjacent to a first side of an end fin among a plurality of fins; lining the deep STI region, including the first side of the end fin, with a passivation layer; depositing an STI oxide into the deep STI region, the passivation layer separating the STI oxide and the first side of the end fin; etching back the passivation layer separating the STI oxide and the first side of the end fin to a specified depth to create a gap; and depositing gate material, the gate material covering the gap.

According to an embodiment of the invention, a fin field effect transistor (FinFET) device includes a plurality of fins; a plurality of shallow trench isolation (STI) regions, each adjacent pair of the plurality of fins being separated by one of the plurality of STI regions; a deep STI region formed on a first side of an end fin among the plurality of fins; and gate material deposited over the plurality of fins and in the deep STI region, the gate material covering both sides of a fin reveal of each of the plurality of fins and covering the first side of the end fin by filling a gap between the first side of the end fin and a gate oxide layer in the deep STI region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, formation of multi-gate FinFET devices that includes shallow STI formation followed by an etch process may lead to an asymmetric STI near the end fins. This may result in poor short channel control and may also lead to leakage because the end fins adjacent the deep STI regions may be submerged in or covered by the STI oxide material, instead of the poly-gate material. Accordingly, embodiments of the method of formation of a device and the device described herein relate to using composite STI with silicon oxide and nitride films. The first layer of silicon nitride film creates a gap between the STI oxide and the end fins that is large enough for the gate material (e.g., polysilicon conductor) deposition. As a result, the end fins are completely wrapped around by the gate, ensuring gate control over the channel for the end fins.

Figure 1:
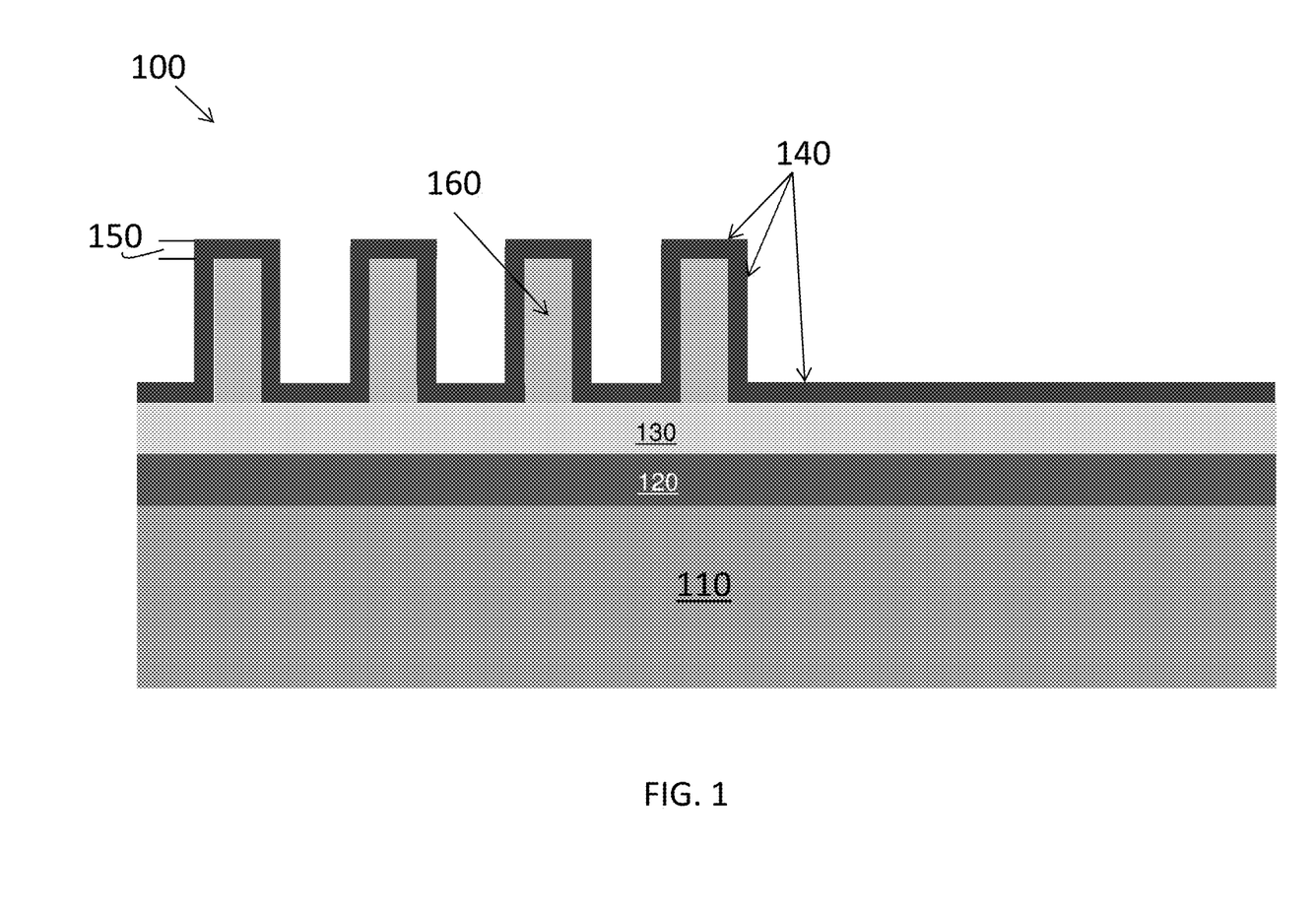
FIG. 1 is a cross-sectional view of a structure used in fin formation according to an embodiment of the invention.

FIG. 1 is a cross-sectional view of a structure 100 used in fin and STI formation according to an embodiment of the invention. A passivation layer such as a silicon nitride (SiN) layer 120 is formed on a substrate 110. The SiN layer 120 may have an exemplary thickness of about 40 nanometers (nm). A layer of an oxide such as undoped silicon glass (USG) 130 is formed over the SiN layer 120. The USG 130 layer may have an exemplary thickness of about 30 nm. Amorphous silicon (a-Si) 160 acts as a mandrel that is used to form spacers used in fin formation. The deposition of the mandrel (a-Si 160) is followed by lithography which includes deposition of an anti-reflective coating such as an organic dielectric layer (ODL) and patterning using photoresist. After reactive ion etching (RIE) of the a-Si 160 to form the shapes shown in FIG. 1, silicon dioxide ($SiO_2$) 140 is deposited. The $SiO_2$ 140 layer may have an exemplary thickness 150 of about 18 nm.

Figure 2:
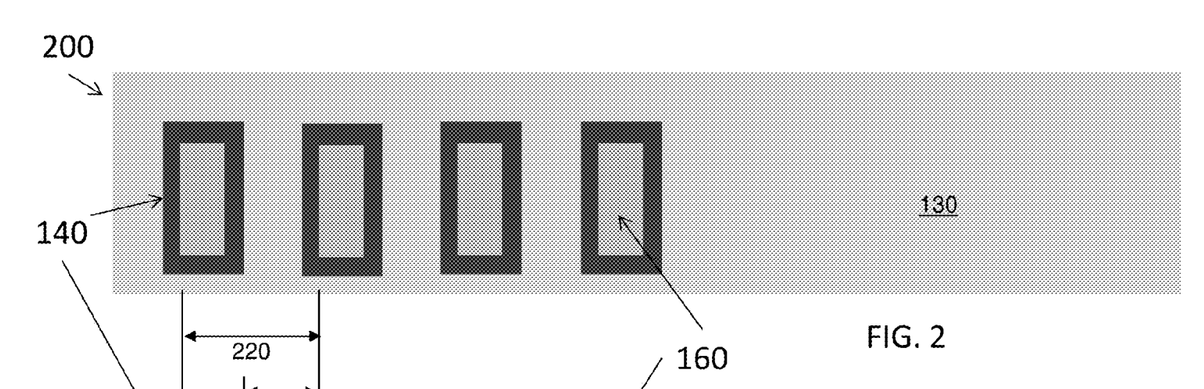
FIG. 2 shows a top view of the structure in FIG. 1 following etching to expose the mandrel.
Figure 3:
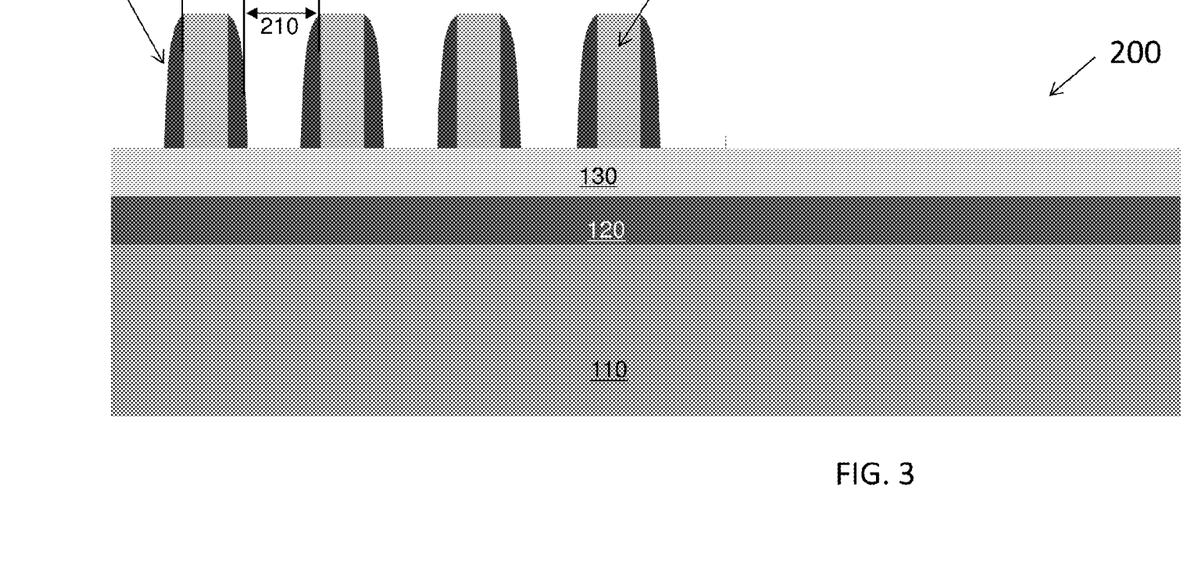
FIG. 3 is a cross-sectional view of the structure shown in FIG. 2.
Figure 4:
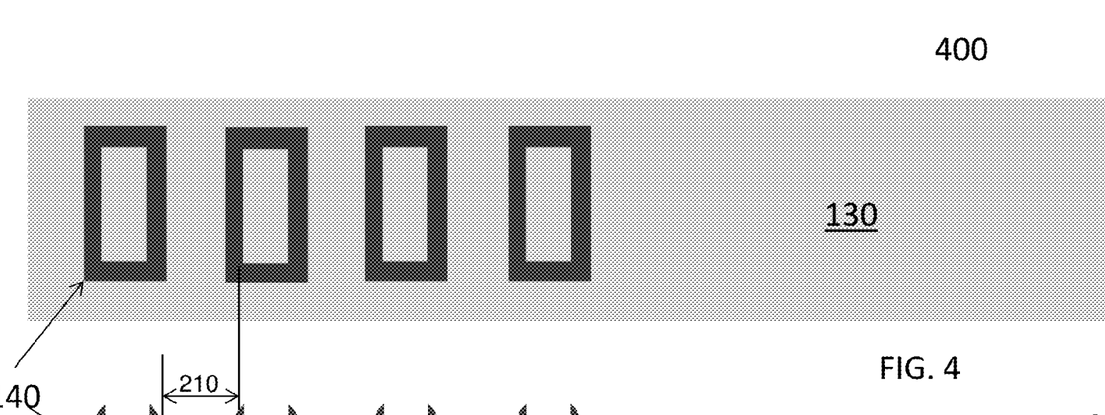
FIG. 4 is a top view of the structure that results from a mandrel pull on the structure shown in FIGS. 2 and 3.
Figure 5:
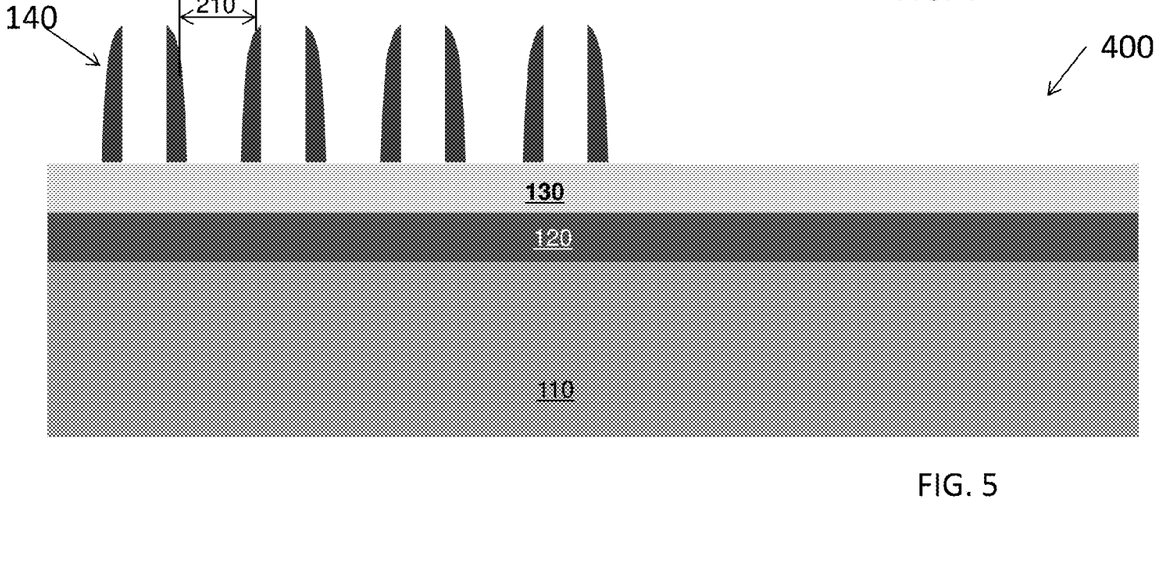
FIG. 5 is a cross-sectional view of the structure shown in FIG. 4.

FIG. 2 shows a top view of the structure 100 in FIG. 1 following etching to expose the mandrel. In this resulting structure 200, as FIG. 2 indicates, the $SiO_2$ 140 above the a-Si 160 is removed. The etching process stops at the USG 130 layer. FIG. 3 is a cross-sectional view of the structure 200 shown in FIG. 2. As indicated, the fin pitch is defined by the spacing 210 and may be, for example, 42 nm with the spacer ($SiO_2$ 140) thickness controlled to 10 nm. In this case, the spacing 220 may be, for example, 84 nm. FIG. 4 is a top view of the structure 400 that results from a mandrel pull on the structure 200 shown in FIGS. 2 and 3. The removal via etching of the a-Si 160 (mandrel) may be referred to as the mandrel pull. FIG. 5 is a cross-sectional view of the structure 400 shown in FIG. 4. The pitch indicated by spacing 210 and, consequently, the fin spacing is unchanged by the mandrel pull. The USG 130 layer is unaffected by the mandrel pull.

Figure 6:
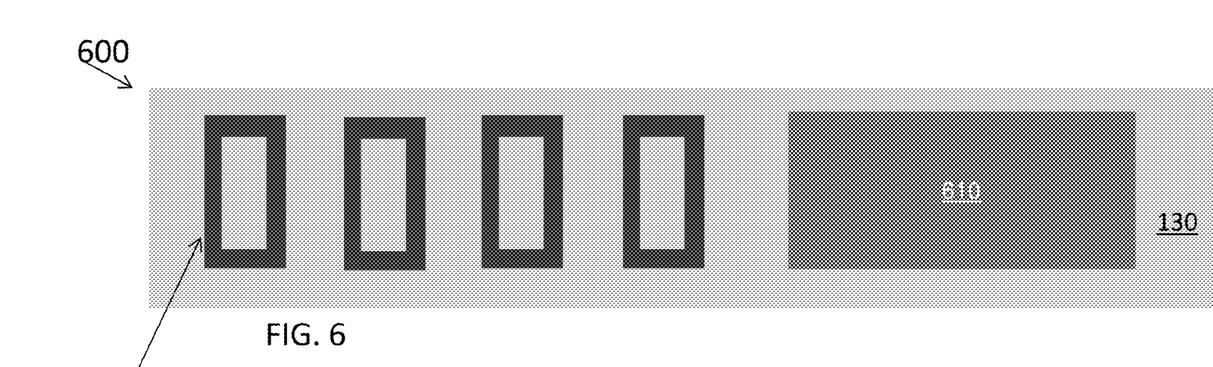
FIG. 6 is a top view of the structure following deposition and patterning of an organic dielectric layer (ODL) on the structure shown in FIGS. 4 and 5.
Figure 7:
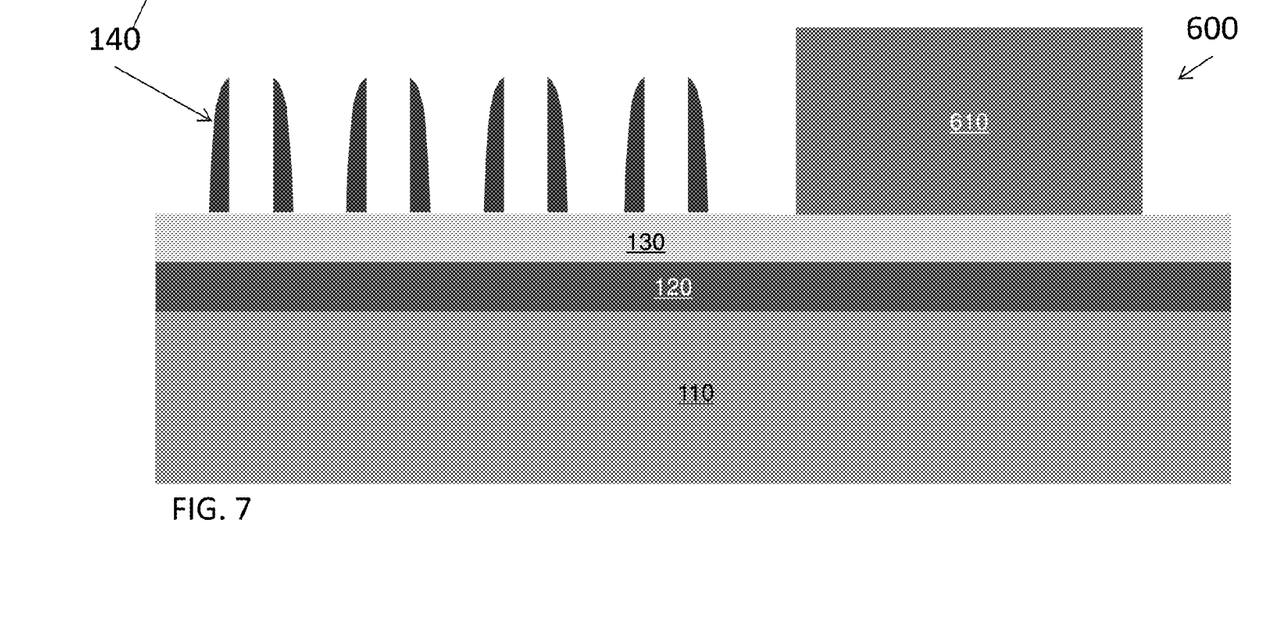
FIG. 7 is a cross-sectional view of the structure shown in FIG. 6.
Figure 8:
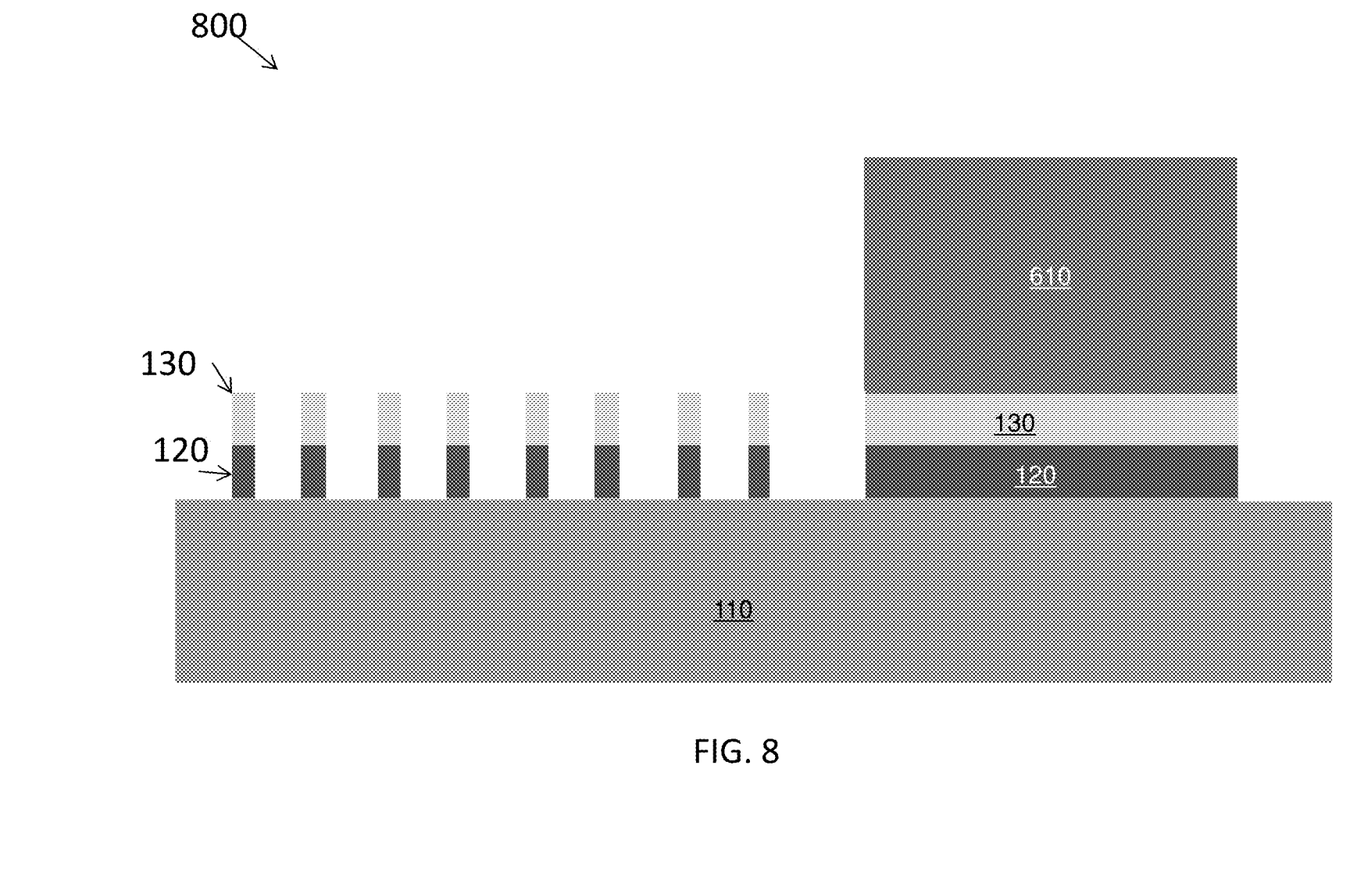
FIG. 8 shows the structure resulting from a lithography process on the structure shown in FIGS. 6 and 7 to transfer the spacer pattern into the USG and SiN layers.

FIG. 6 is a top view of the structure 600 following deposition and patterning of an organic dielectric layer (ODL) 610 on the structure 400 shown in FIGS. 4 and 5. FIG. 7 is a cross-sectional view of the structure 600 shown in FIG. 6. The ODL 610 is deposited on the USG 130 layer next to the fin spacers ($SiO_2$ 140). FIG. 8 shows the structure 800 resulting from a lithography process on the structure 600 shown in FIGS. 6 and 7 to transfer the spacer ($SiO_2$ 140) pattern into the USG 130 and SiN layer 120. The fin spacers ($SiO_2$ 140) are removed by the lithography. By depositing the ODL 610 prior to patterning (as shown in FIGS. 6 and 7), the area of the substrate 110 below the ODL 610 is kept intact during reactive ion etching (RIE) of the SiN layer 120 and the USG 130 layer, as shown in FIG. 9.

Figure 9:
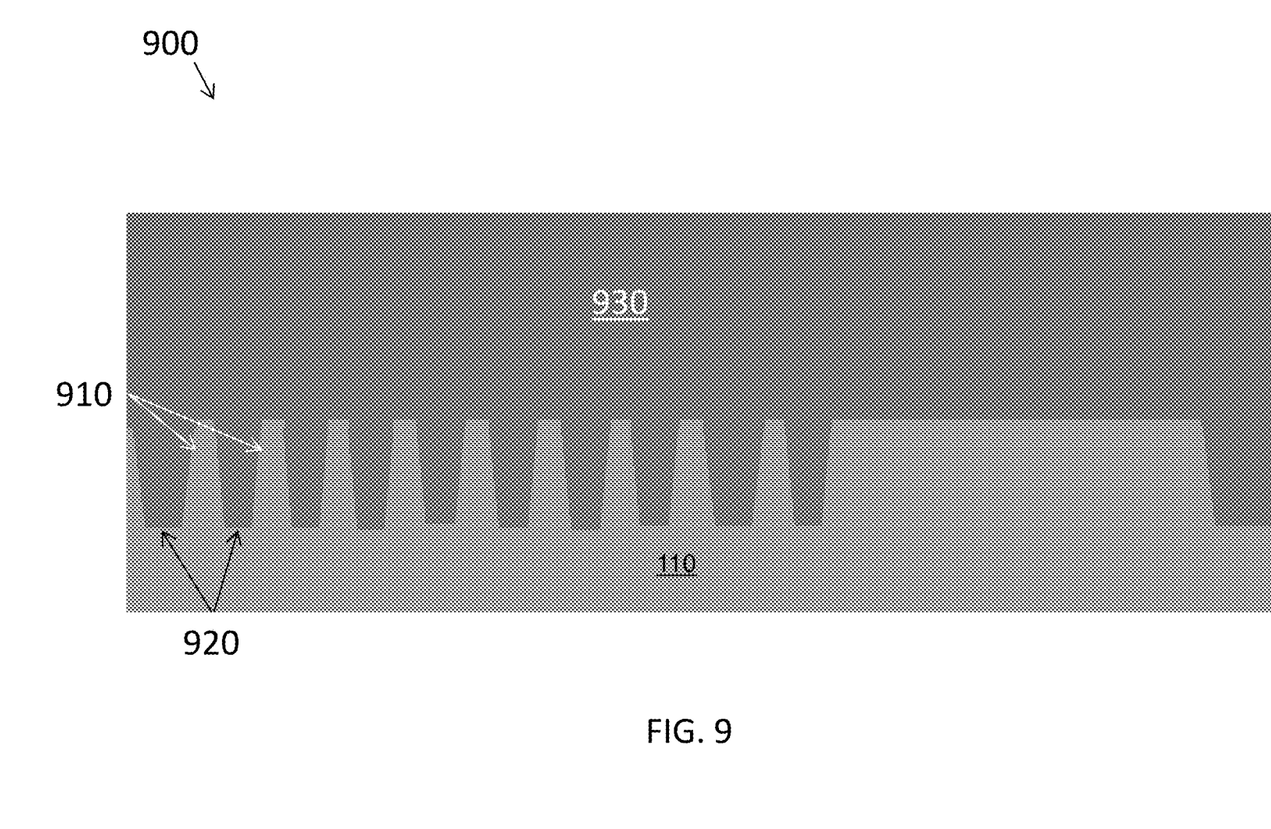
FIG. 9 shows the structure resulting from reactive ion etching of the structure shown in FIG. 8 to form the fins.
Figure 10:
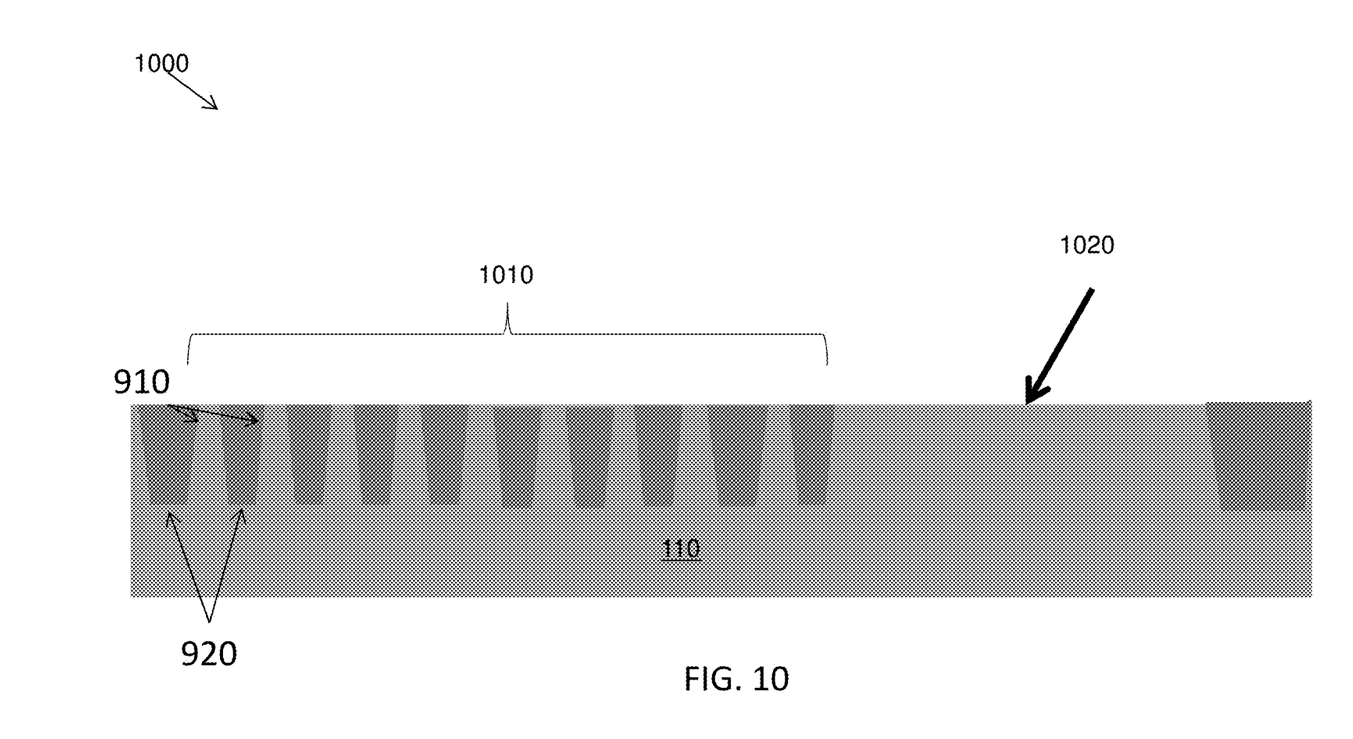
FIG. 10 shows the structure resulting from planarization of the structure shown in FIG. 9.

FIG. 9 shows the structure 900 resulting from reactive ion etching of the structure 800 shown in FIG. 8 to form the fins 910. The fins 910 are etched by the RIE process, thereby exposing the region 920 for STI deposition. The depth of the fins 910 may be, for example, 100 nm. The SiN layer 120 and USG 130 layer are removed and the substrate 110 that was below the ODL 610 deposition is left intact. The RIE process to etch the fins 910 is followed by deposition of a high-aspect-ratio process (HARP) oxide 930. The deposition may be achieved by a chemical vapor deposition (CVD) process using tetraethylorthosilicate (TEOS), for example. FIG. 10 shows the structure 1000 resulting from planarization of the structure 900 shown in FIG. 9. The planarization may be accomplished by a chemical-mechanical planarization (CMP) process, for example. As FIG. 10 illustrates, the planarization process results in a fin region 1010 for field effect transistors (FETs) and a planar region 1020 for passive devices (e.g., electrostatic-sensitive device (ESD)).

Figure 11:
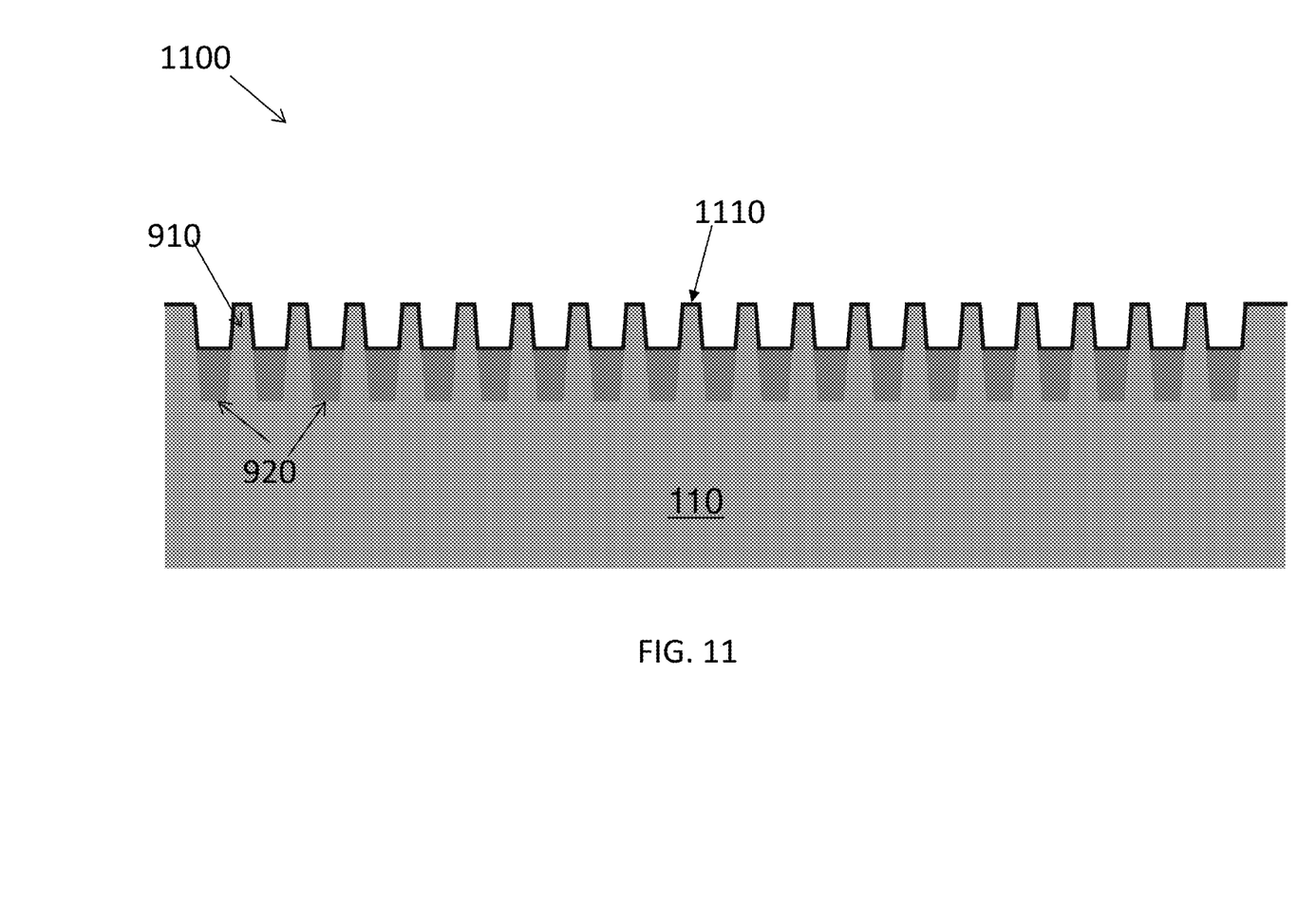
FIG. 11 shows the structure resulting from an etch of the structure shown in FIG. 10 to recess the HARP oxide, followed by deposition of an oxide film.
Figure 12:
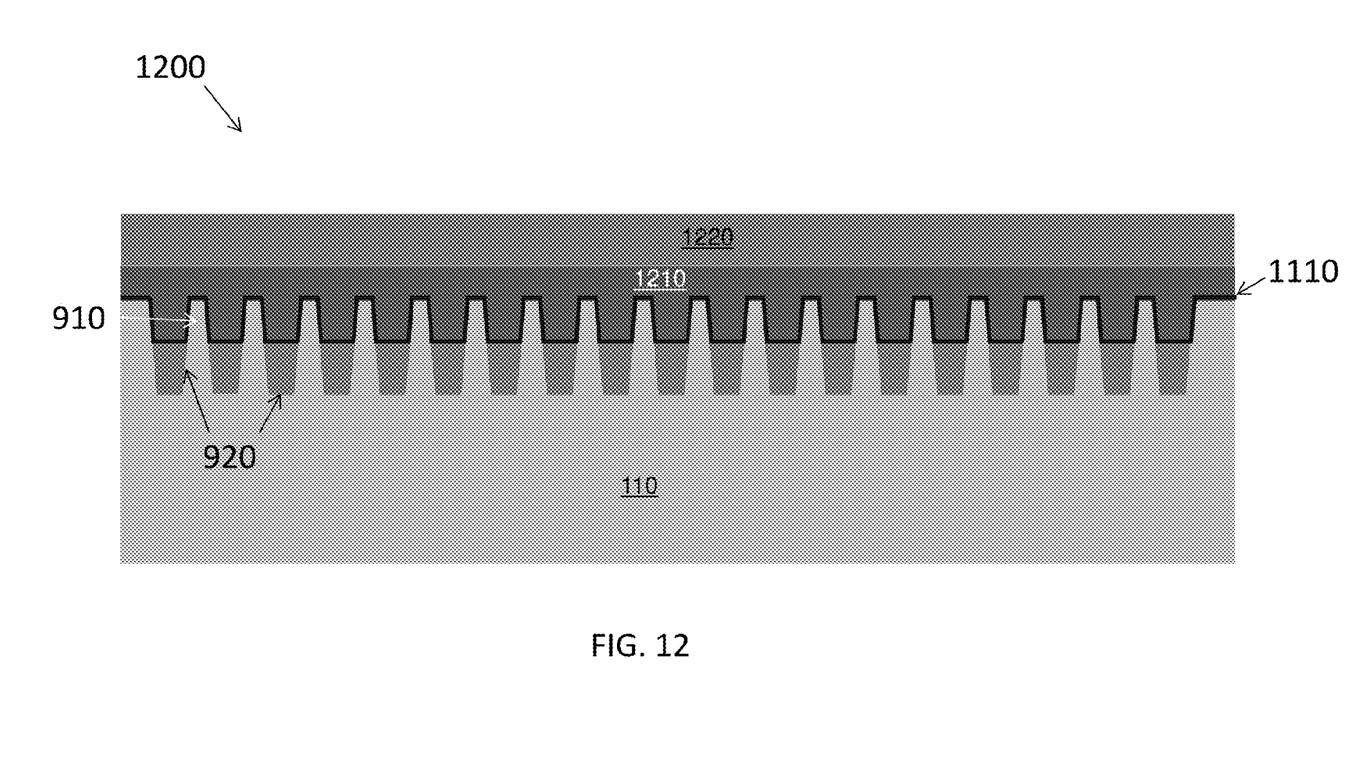
FIG. 12 shows the structure following deposition of a SiN layer and an ODL on the structure shown in FIG. 11.
Figure 13:
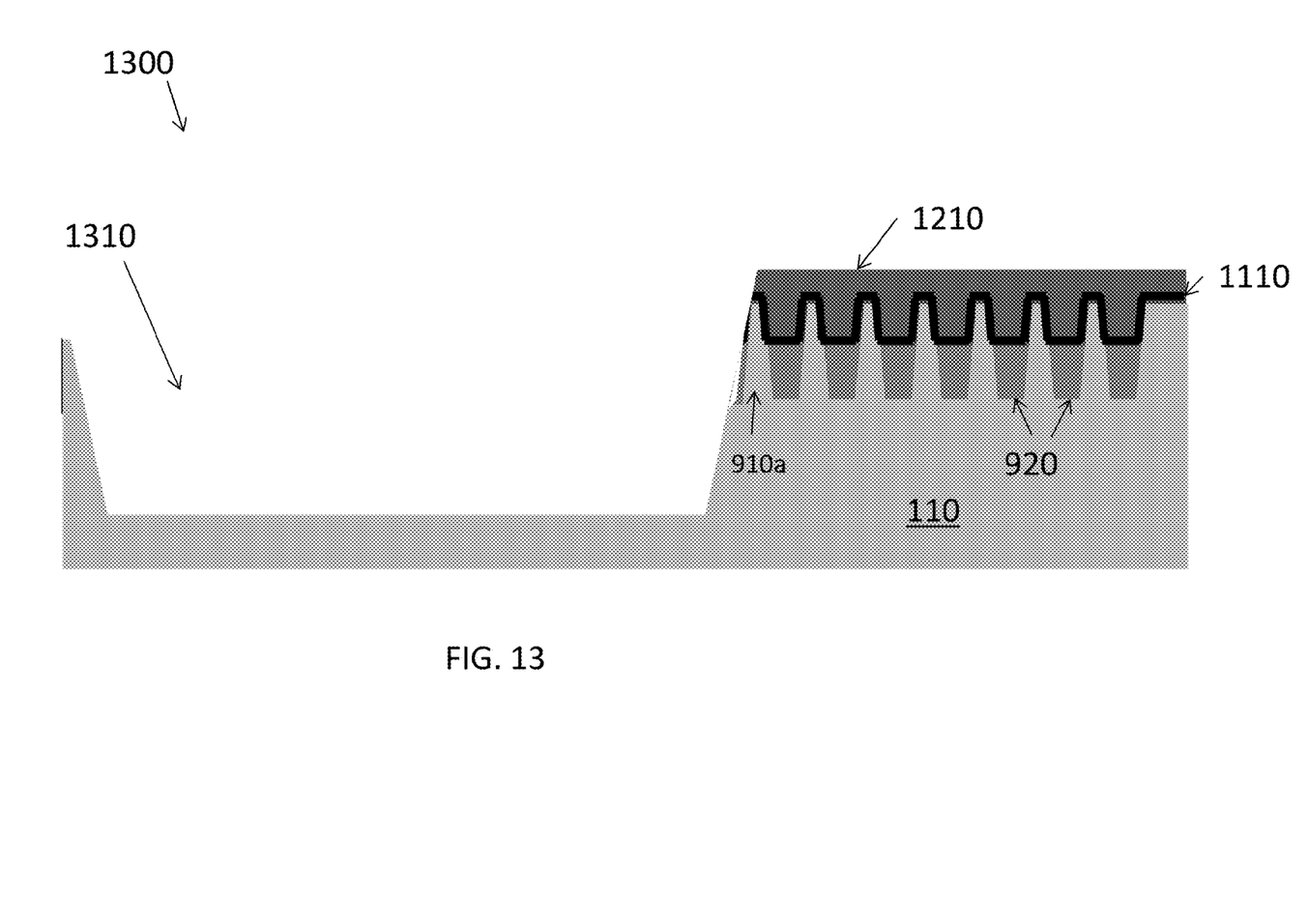
FIG. 13 shows the structure following the formation of a deep STI region.

FIG. 11 shows the structure 1100 resulting from an etch of the structure 1000 shown in FIG. 10 to recess the HARP oxide 930, followed by deposition of an oxide film 1110. For simplicity, only the fin region 1010 is shown in FIG. 11, and the planarization region 1020 is not shown. The fins 910 are etched to expose the region 920 for STI deposition. An oxide film 1110 is deposited over the fins 910 and region 920 for STI deposition. FIG. 12 shows a structure 1200 following deposition of an SiN 1210 layer and an ODL 1220 on the structure 1100 shown in FIG. 11. A passivation layer such as silicon nitride (SiN) 1210 is first deposited. The SiN 1210 may be deposited with a thickness of 60 nm, for example. The SiN 1210 is deposited in the exposed portion of the region 920 for STI deposition. The SiN 1210 deposition is followed by deposition of an optical planarizing under-layer (OPL) silicon containing anti-reflective coating (SiARC) and resist coating (ODL) 1220. The ODL 1220 may be deposited with a thickness of 200 nm, for example. FIG. 13 shows the structure 1300 following the formation of a deep STI region 1310. Following a hardmask etch removing the ODL 1220 layer from the structure 1200 shown in FIG. 12, the substrate 110 in the deep STI region 1310 is etched to a specified depth. This process may be referred to as a dual-STI active silicon cut process. The remaining region 920 for STI deposition is the shallow STI region.

Figure 14:
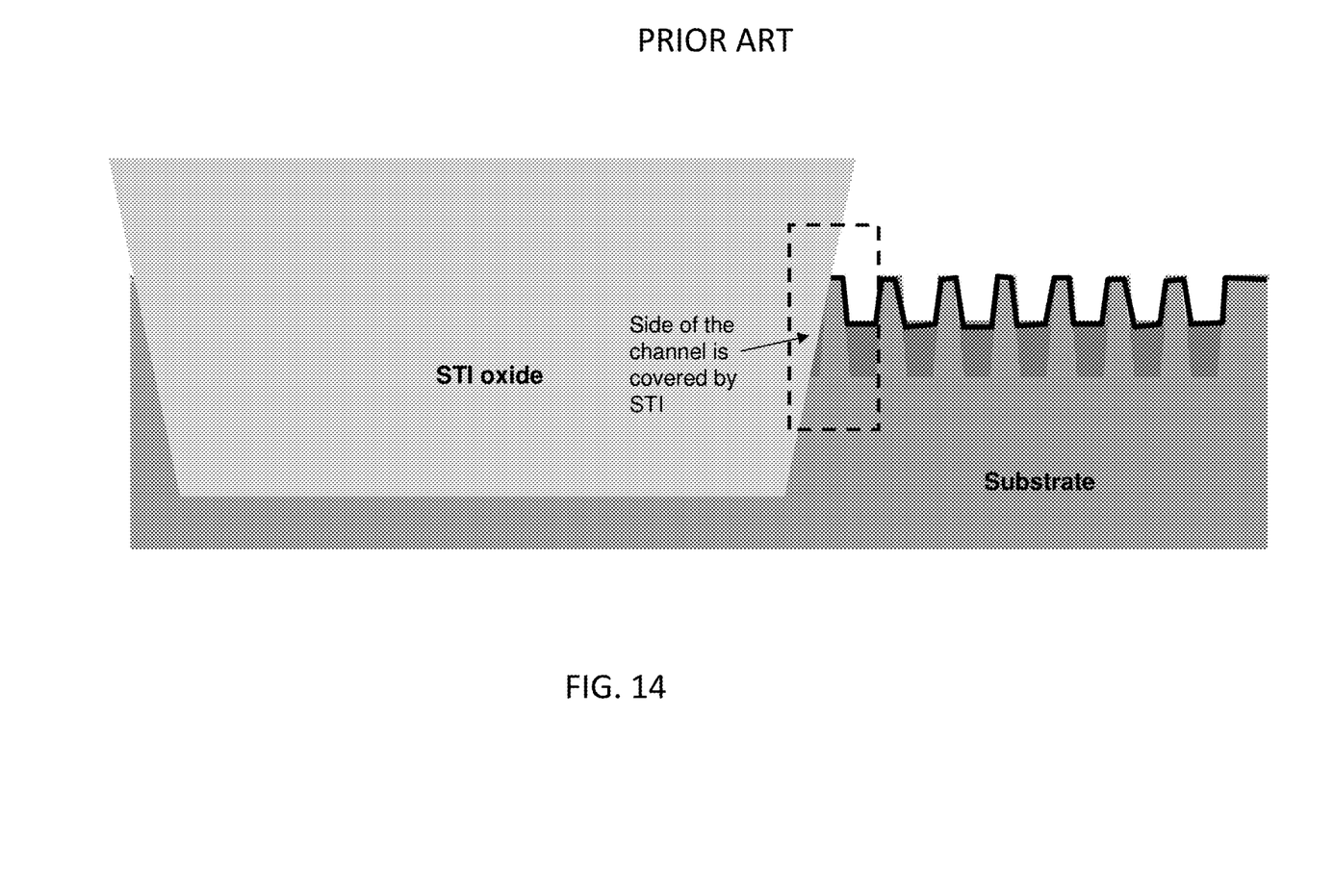
FIG. 14 shows the result of depositing an STI oxide in the deep STI region of the structure shown in FIG. 13.
Figure 15:
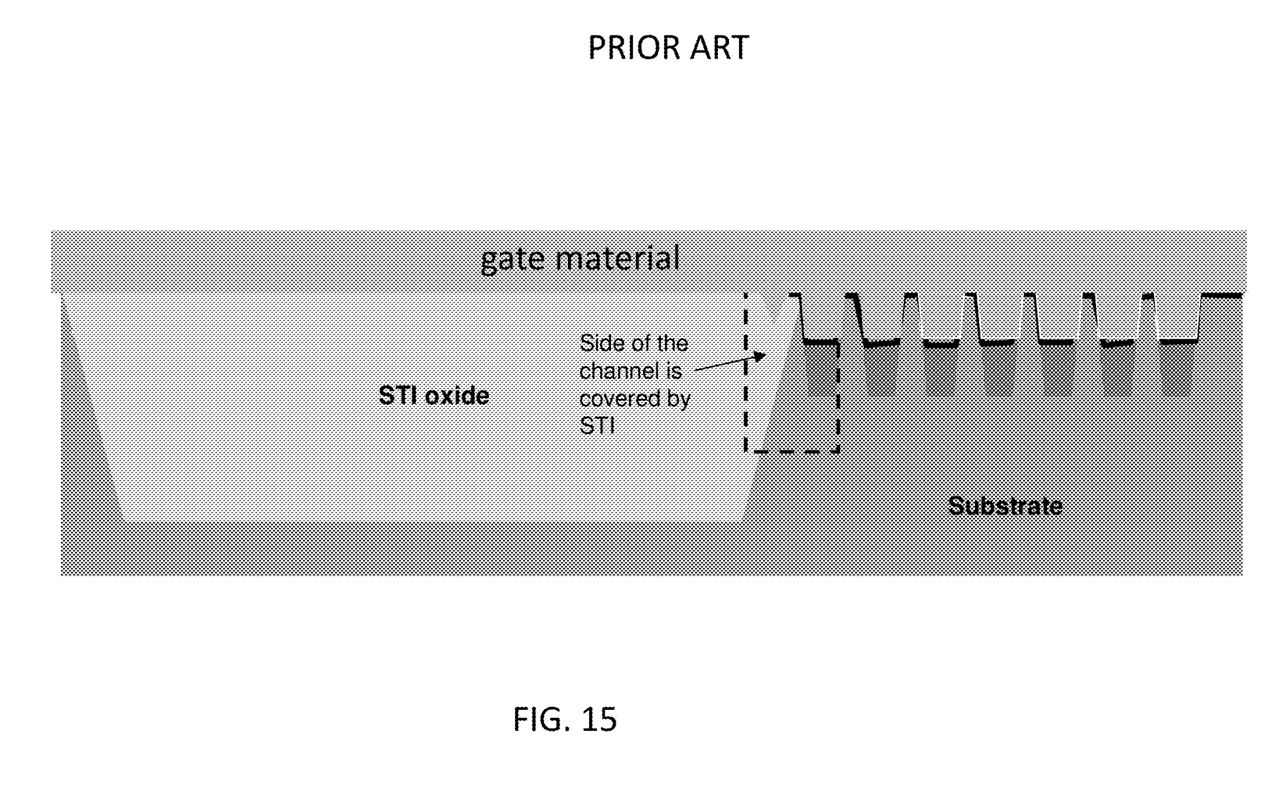
FIG. 15 shows the structure of FIG. 14 following deposition of gate material.

At this stage, STI oxide may be deposited in the deep STI region 1310 in a conventional process that may result in one side of the end fin 910a being covered in the STI oxide and leading to the leakage issues discussed above. FIG. 14 shows the result of depositing an STI oxide in the deep STI region of the structure 1300 shown in FIG. 13. As FIG. 14 indicates, the side of the end fin that is closest to the deep STI region is covered by the STI oxide. FIG. 15 shows the structure of FIG. 14 following deposition of gate material. As FIG. 15 illustrates, the gate material cannot cover the side of the end fin closest to the deep STI region because of the STI oxide. According to an embodiment of the invention, STI oxide is not deposited in the deep STI region 1310 shown in FIG. 13 as it is in prior art FIGS. 14 and 15.

Figure 16:
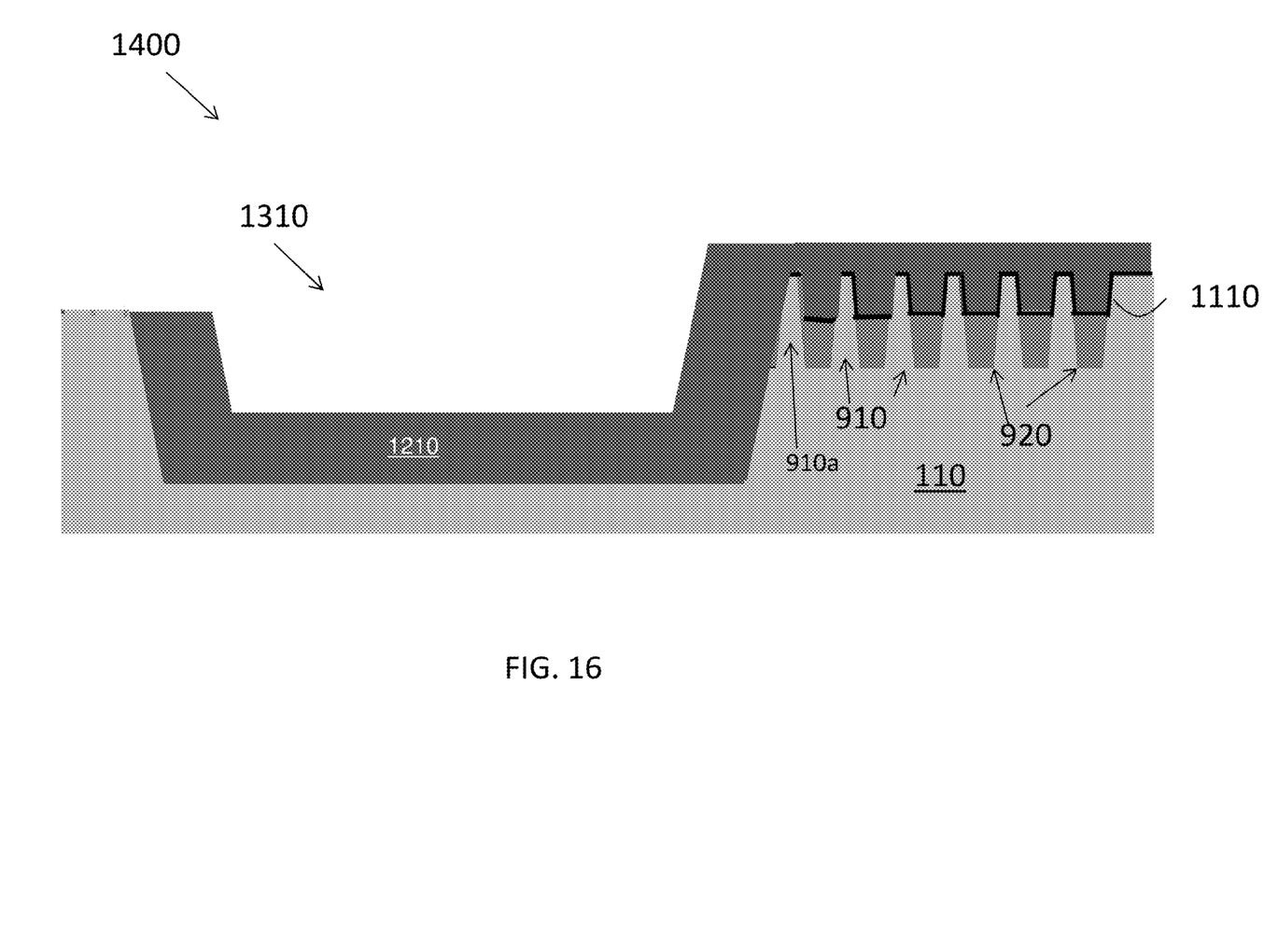
FIG. 16 shows the structure following redeposition of the SiN on the structure shown in FIG. 13.
Figure 17:
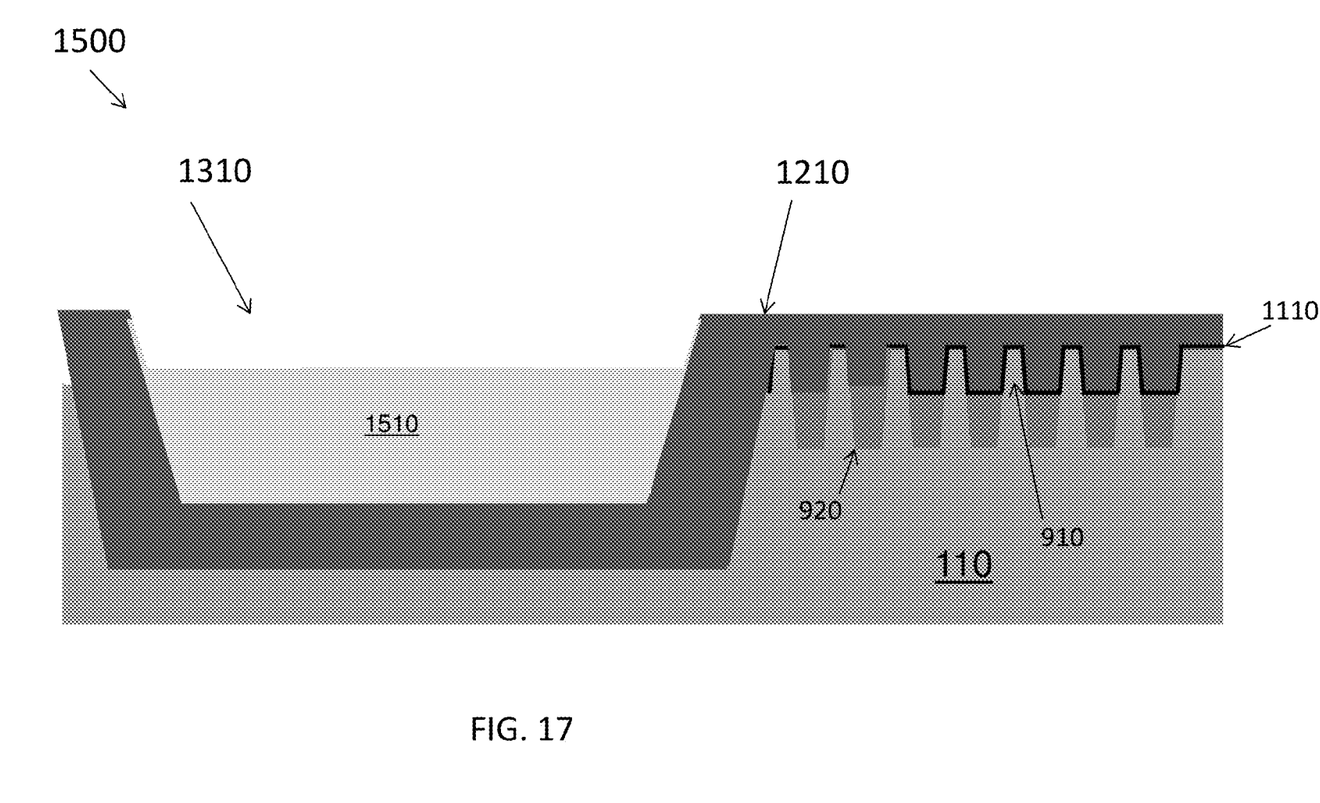
FIG. 17 shows the structure following deposition and etch back of an STI oxide in the structure shown in FIG. 16.

FIG. 16 shows the structure 1400 following redeposition of the SiN 1210 on the structure 1300 shown in FIG. 13. The SiN 1210 film covers the bottom and sidewalls of region 920 for STI deposition and the deep STI region 1310. The SiN 1210 also covers both sides of the fins 910, including end fin 910a. FIG. 17 shows the structure 1500 following deposition and etch back of an STI oxide 1510 in the structure 1400 shown in FIG. 16. As FIG. 17 illustrates, the previously re-deposited SiN 1210 shields the end fin 910a from the STI oxide 1510.

Figure 18:
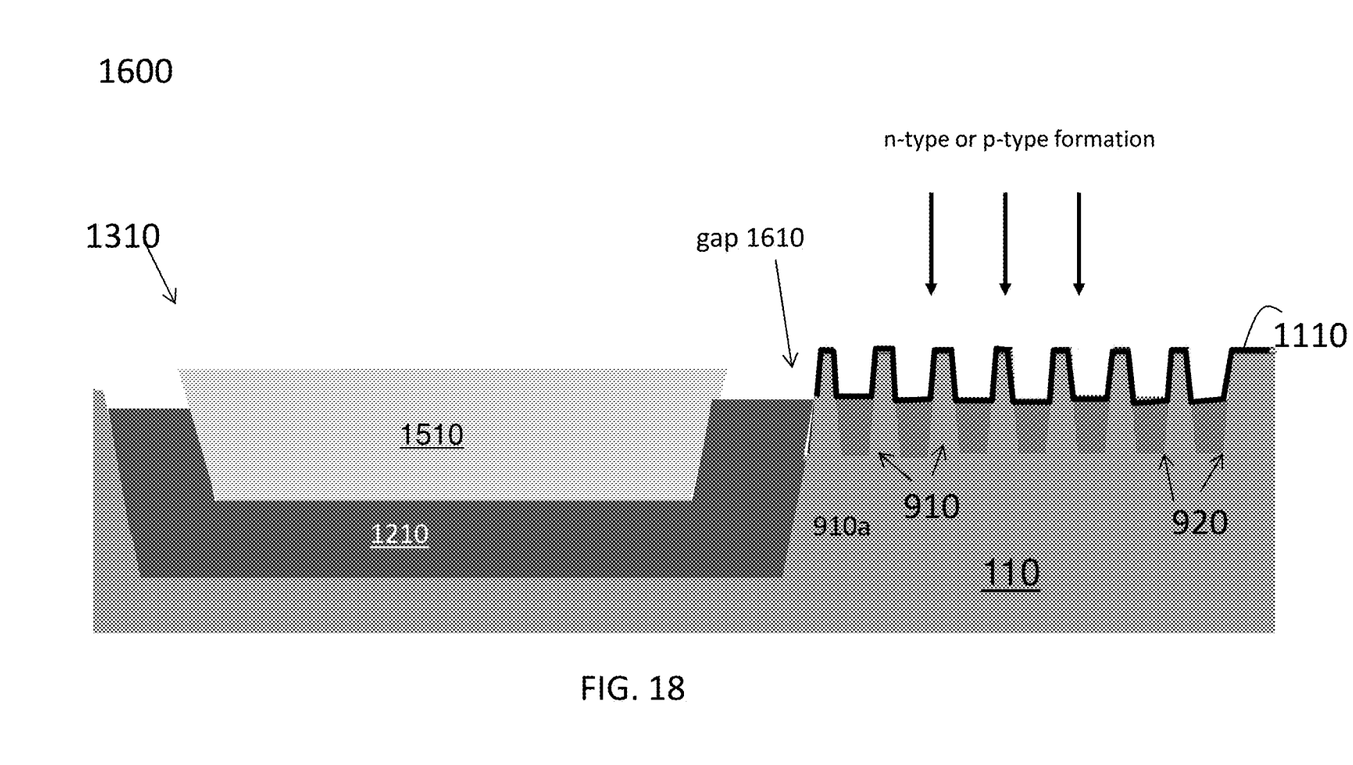
FIG. 18 shows the structure resulting following anneal and etch back of the SiN of the structure shown in FIG. 17.
Figure 19:
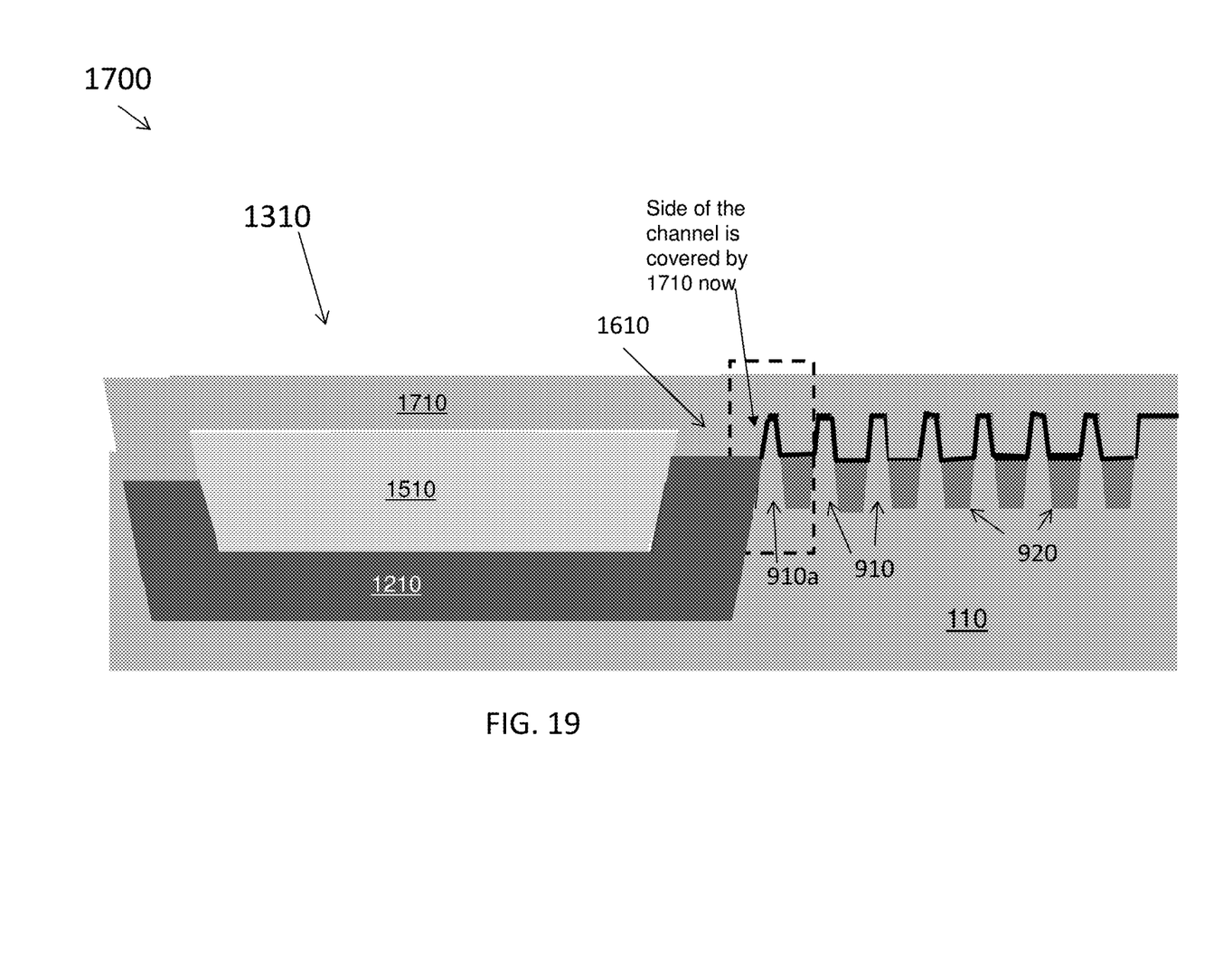
FIG. 19 shows the structure following formation of the gate material.

FIG. 18 shows the structure 1600 following anneal and etch back of the SiN 1210 of the structure 1500 shown in FIG. 17. The STI oxide 1510 may first be annealed. The anneal process may be performed at 1150 degrees Celsius for 30 minutes, for example. The SiN 1210 portions may then be etched back through deposition of HARP, for example. As FIG. 18 illustrates, the deposition (re-deposition) of SiN 1210 prior to the deposition of the STI oxide 1510 facilitates the formation of the gap 1610 on the side of the end fin 920a on the deep STI region 1310 side. That is, the portion of the SiN 1210 between the STI oxide 1510 and the side of the end fin 910a (in the gap 1610) is etched to a specified depth. In the example shown by FIG. 18, the depth is such that a same portion of the fins 910 (including the deep STI region 1310 side of the end fin 910a) is exposed for subsequent deposition of the gate material 1710 (FIG. 19). That is, the fin reveal on both sides of the end fin 910a is the same and, consequently, the channel width on both sides of the end fin 910a will be the same. The significance of this gap 1610 is that it prevents STI oxide 1510 from covering the end fin 920a, thereby mitigating the leakage issues discussed above. At this stage, the structure 1600 undergoes formation of n-type and p-type wells through implantation of phosphorous or difluoroboron ($BF_2$), respectively, as also indicated in FIG. 18.

FIG. 19 shows the structure 1700 following formation of the gate material 1710. The gate material 1710 may be a polysilicon (polycrystalline silicon). Because of the gap 1610 created on the deep STI region 1310 side of the end fin 910a between the STI oxide 1510 and the end fin 910*a*, the gate material 1710 fills the gap 1610 and completely wraps around the end fin 910*a*. As a result, gate control over the channel for the end fin 910*a* is ensured and the potential leakage issues discussed above are avoided.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A fin field effect transistor (FinFET) device, comprising:
   a plurality of fins, each of the plurality of fins being covered by an oxide film;
   a plurality of shallow trench isolation (STI) regions, each adjacent pair of the plurality of fins being separated by one of the plurality of STI regions;
   a deep STI region formed on a first side of an end fin among the plurality of fins;
   a passivation layer lining the deep STI region;
   an STI oxide above the passivation layer in the deep STI region; and
   gate material deposited over the oxide film covering the plurality of fins and in the deep STI region, the gate material covering both sides of a fin reveal of each of the plurality of fins and covering the oxide film covering the first side of the end fin by filling a gap directly between the oxide film that covers the first side of the end fin and a sidewall of the STI oxide in the deep STI region that extends from the oxide film that covers the first side of the end fin to the sidewall of the STI oxide.

2. The device according to claim 1, wherein a depth of the gap is based on an etch back of the passivation layer lining the deep STI region.

3. The device according to claim 2, wherein the passivation layer is silicon nitride (SiN).

4. The device according to claim 2, wherein the passivation layer lining the deep STI region is a redeposition of the passivation layer removed during an etch of the deep STI region.

5. The device according to claim 2, wherein the depth of the gap is specified to result in an equal fin reveal of the end fin on the first side and a second side opposite to the first side.

6. The device according to claim 5, wherein a channel width on the first side of the end fin and channel widths between each pair of fins is a same.

7. The device according to claim 1, wherein the gate material is a polysilicon.

8. The device according to claim 1, wherein the plurality of fins are spaced apart at a specified interval based on a plurality of spacers used to form the plurality of fins.

9. The device according to claim 8, wherein the plurality of spacers comprise silicon dioxide ($SiO_2$).

10. The device according to claim 8, wherein the plurality of spacers are shaped using an amorphous silicon (a-Si) mandrel.

* * * * *